United States Patent
Kawakami

(10) Patent No.: US 7,541,625 B2
(45) Date of Patent: Jun. 2, 2009

(54) SEMICONDUCTOR INTEGRATED CIRCUIT

(75) Inventor: Yoshiyuki Kawakami, Osaka (JP)

(73) Assignee: Panasonic Corporation, Osaka (JP)

( * ) Notice: Subject to any disclaimer, the term of this patent is extended or adjusted under 35 U.S.C. 154(b) by 6 days.

(21) Appl. No.: 11/883,539

(22) PCT Filed: Mar. 3, 2006

(86) PCT No.: PCT/JP2006/304122

§ 371 (c)(1),
(2), (4) Date: Aug. 2, 2007

(87) PCT Pub. No.: WO2006/095655

PCT Pub. Date: Sep. 14, 2006

(65) Prior Publication Data

US 2008/0164496 A1    Jul. 10, 2008

(30) Foreign Application Priority Data

Mar. 11, 2005  (JP)  ............................ 2005-069696

(51) Int. Cl.
*H01L 21/768* (2006.01)
(52) U.S. Cl. ................ 257/211; 257/773; 257/E21.583
(58) Field of Classification Search .................. 257/208
See application file for complete search history.

(56) References Cited

U.S. PATENT DOCUMENTS 4,903,344 A * 2/1990 Inoue ........................... 365/51
6,693,315 B2   2/2004 Kuroda et al.
2004/0188849 A1 * 9/2004 Suga ........................... 257/773
2005/0023568 A1   2/2005 Nishimura

FOREIGN PATENT DOCUMENTS

| JP | 06-061230 | 3/1994 |
|---|---|---|
| JP | 10-125681 | 5/1998 |
| JP | 11-067918 | 3/1999 |
| JP | 2002-158278 | 5/2002 |
| JP | 2002-231815 | 8/2002 |
| JP | 2003-282569 | 10/2003 |
| JP | 2004-296864 | 10/2004 |
| JP | 2005-057003 | 3/2005 |

* cited by examiner

*Primary Examiner*—Wael Fahmy
*Assistant Examiner*—Tifney L Skyles
(74) *Attorney, Agent, or Firm*—McDermott Will & Emery LLP

(57) ABSTRACT

When dummy patterns are arranged to planarize LSI layout patterns, a plurality of dummy patterns 1 are arranged in a wiring layer in which signal wiring patterns 2 are formed, so as to be inclined at an angle of generally 45 degrees toward the associated signal wiring patterns 2. These dummy patterns 1 cross signal wiring patterns 3 formed in another vertically adjacent wiring layer to have an inclination angle of generally 45 degrees. A plurality of dummy patterns 13 are located in the wiring layer in which the signal wiring patterns 3 are formed, so as to be inclined at an angle of generally 45 degrees toward the associated signal wiring patterns 3. The dummy patterns 1 formed in one of the adjacent wiring layers cross the dummy patterns 13 formed in the other wiring layer at an angle of generally 90 degrees. This reduces fluctuations in wiring capacitance and equalizes fluctuations in the wiring capacitance to the maximum extent.

9 Claims, 4 Drawing Sheets

SEMICONDUCTOR INTEGRATED CIRCUIT

TECHNICAL FIELD

The present invention relates to parasitic element extraction for extracting parasitic elements produced during automatic placing and routing in semiconductor circuit design, and more particularly relates to a semiconductor integrated circuit in which, in LSI layout, dummy patterns are placed to completely planarize, by CMP (chemical mechanical polishing), a semiconductor substrate on which circuits are laid out.

BACKGROUND ART

With a recent demand for increases in the density and level of integration of semiconductor devices, there has been a demand for formation of finer patterns in a fabrication process for a semiconductor circuit. Typically, semiconductor devices whose density and level of integration are increased often have a multilayer wiring structure in which a plurality of wiring layers are formed on a substrate while being isolated from one another by associated insulating films. Wiring layers forming part of such a semiconductor device need to be finely patterned in an exposure process step of the fabrication process. When the top surface of a substrate on which a pattern mask is placed is uneven and has low flatness, this reduces the resolution of the exposure process step. As a result, a fine pattern cannot be formed. When the degree of wiring congestion significantly varies among regions of a certain wiring layer, this makes it difficult to completely planarize the top surface of a substrate even by CMP. To cope with this, a dry etching process must keep the states of chips on a wafer being etched always fixed. To do this, dummy patterns (alternatively, referred to as dummy metals) called dummy wirings must be placed in regions of a wiring having low degrees of wiring congestion, thereby allowing each chip to have the same area ratio (aperture ratio).

Accordingly, dummy patterns are additionally formed on regions of a substrate in which the interwiring distance is wide. The existence of such patterns produces additional capacitance for peripheral wirings. Consequently, a malfunction, noise generation and other causes all arising from fluctuations in the capacitance of a signal wiring pattern affect the circuit characteristics. For present high-performance semiconductor integrated circuits, it is an important challenge to reduce the coupling capacitance during the layout design phase. It can be said as one of very important challenges in terms of timing design to, even when additional capacitance is produced by additionally forming dummy patterns, reduce the additional capacitance as much as possible or equalize the additional capacitance.

Additional capacitance arising from the existence of such dummy patterns can be reduced by locating the dummy patterns away from an associated wiring pattern as much as possible. However, since dummy patterns are originally intended to be located in the gaps between adjacent pairs of wirings, the distance between each adjacent pair of wiring patterns is limited. In a case where dummy patterns are uniformly a fixed distance away from arbitrary wiring patterns, additional capacitance becomes uneven. The reason for this is that each additional capacitance depends on the size of an associated wiring pattern. To cope with the above-mentioned problem, the following method has been disclosed, as a known technique for additionally forming dummy patterns, in Patent Document 3: The distance between a signal wiring pattern and an associated dummy pattern is set according to the width of the signal wiring pattern, and when the distance therebetween is smaller than the set distance, this restrains the dummy pattern from being placed. This method can not only prevent the proportion of dummy metals on a predetermined area of each chip (aperture ratio) from being locally reduced but also avoid a deterioration in the performance of a signal associated with an existing wiring pattern due to the formation of dummy patterns. Furthermore, as disclosed in Patent Document 2, there is also a technique in which the locations of dummy patterns formed in different layers are prevented from coinciding with one another when viewed in plane, thereby reducing additional capacitance. In general, in cases where respective patterns formed in upper and lower layers coincide with each other when viewed in plane or in cases where patterns formed in the same layer are laterally adjacent to each other, a large capacitance is added to a signal wiring pattern. On the other hand, in cases where respective patterns in different upper and lower wiring layers are diagonally placed so as to be prevented from coinciding with each other when viewed in plane, capacitance is hardly produced between the patterns. A technique utilizing this physical phenomenon has been disclosed in Patent Document 2.

Meanwhile, it is one of solutions to equalization of additional capacitance to always maintain the same spatial relationship between a wiring pattern and an adjacent dummy pattern. The following technique has been disclosed, as a known technique for additionally forming dummy patterns, in Patent Document 1: Dummy patterns each form the shape of a cross, and the length of each of extending parts of this cross can be arbitrarily changed. According to this technique, additional capacitance added to the existing wiring pattern can be substantially equalized independently of the location of an existing wiring pattern formed in a wiring layer above or below these dummy patterns forming the shape of a cross. Furthermore, even when the existing wiring pattern is not disposed on a wiring grid, the intervals between dummy patterns and wiring patterns can be freely set at a predetermined value by arbitrarily changing the length of the extending part of the cross, thereby equalizing the intervals.

Patent Document 1: Japanese Unexamined Patent Application Publication No. 6-61230 (page 3, FIG. 1)

Patent Document 2: Japanese Unexamined Patent Application Publication No. 2002-231815 (page 5, FIG. 1)

Patent Document 3: Japanese Unexamined Patent Application Publication No. 2003-282569 (page 9, FIG. 1)

DISCLOSURE OF THE INVENTION

Problems that the Invention is to Solve

In the technique of Patent Document 1, additional capacitance added to existing wiring patterns above or below dummy patterns due to the existence of the dummy patterns can be substantially equalized. However, since the dummy patterns each form the shape of a cross, the data amount is increased. For example, while a rectangular dummy pattern can be defined by four vertices, the shape of a cross consists of twelve vertices when expressed in vertex coordinates. Since the number of dummy patterns is usually greater than that of signal wiring patterns, the data amount for cross-shaped dummy patterns becomes twice or more larger than that for rectangular dummy patterns. An increase in the data size makes it difficult to handle cross-shaped dummy patterns even using computer processing. Therefore, the data amount is desirably small. Furthermore, in the technique of Patent Document 1, cross-shaped dummy patterns are located parallel to signal wiring patterns formed in the wiring layer in which the dummy patterns are formed. This increases additional capacitance produced between the signal wiring patterns and the dummy patterns due to the existence of the dummy patterns.

Furthermore, in Patent Document 2, dummy patterns respectively formed in two vertically adjacent wiring layers are prevented from coinciding with each other when viewed in plane. Therefore, capacitance additionally generated by these dummy patterns is not large. However, since the regions of wiring layers in which dummy patterns can be formed are limited, this may prevent a satisfactory aperture ratio from being provided. The reason for this is as follows: Even on condition that the number of signal wiring patterns is small, if wiring patterns are alternately placed in different layers, dummy patterns cannot be placed.

Moreover, in Patent Document 3, the separation distances between signal wiring patterns and associated dummy patterns are restricted according to types of the signal wiring patterns. However, while this method restricts the separation distances between signal wiring patterns and associated dummy patterns which are both formed in the same wiring layer, no consideration is given to additional capacitance between wiring patterns and associated dummy patterns respectively formed in two vertically adjacent wiring layers. Therefore, such additional capacitance produced between different layers turn into a problem.

It is an object of the present invention to reduce the additional capacitance produced between a dummy pattern and a wiring pattern formed in a wiring layer in which the dummy pattern is formed while equalizing, with the data size reduced, fluctuations in the additional capacitance produced between the dummy pattern and a wiring pattern formed in another wiring layer vertically adjacent to the wiring layer.

Means of Solving the Problems

In order to achieve the above object, the present invention is configured such that a plurality of dummy patterns are routed so as to be inclined at an angle of, e.g., 45 degrees with respect to the direction of routing of wiring patterns, such as signal wiring patterns.

More particularly, a semiconductor integrated circuit of the present invention includes a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed. When the direction of extension of one of the plurality of wiring patterns is used as a reference direction, the plurality of dummy patterns extend in a direction forming an angle of 45 degrees with respect to the reference direction.

In the semiconductor integrated circuit of the present invention, some of the plurality of dummy patterns adjacent to any one of the plurality of wiring patterns may be located the same distance away from said any one of the plurality of wiring patterns.

In the semiconductor integrated circuit of the present invention, the plurality of dummy patterns may be rectangular.

In the semiconductor integrated circuit of the present invention, the plurality of dummy patterns may include a plurality of rectangles having different sizes.

In the semiconductor integrated circuit of the present invention, some of the plurality of dummy patterns formed in one of the plurality of wiring layers may cross some other ones of the plurality of dummy patterns formed in vertically adjacent one of the plurality of wiring layers at an angle of 90 degrees.

In the semiconductor integrated circuit of the present invention, the dummy patterns may include potential-fixed dummy patterns connected to a fixed potential and floating dummy patterns prevented from being connected to a fixed potential, and some of the potential-fixed dummy patterns may be located adjacent to the associated wiring patterns.

In the semiconductor integrated circuit of the present invention, the floating dummy patterns may make up 50% or more of the number of the plurality of dummy patterns.

In the semiconductor integrated circuit of the present invention, the plurality of dummy patterns may include a potential-fixed dummy pattern connected to a fixed potential and floating dummy patterns prevented from being connected to a fixed potential, some of the floating dummy patterns may be located adjacent to the associated wiring patterns, and one of the dummy patterns adjacent to said some of the floating dummy patterns located adjacent to the associated wiring patterns may be the potential-fixed dummy pattern.

In the semiconductor integrated circuit of the present invention, the fixed potential may be a power supply potential or a ground potential.

A semiconductor integrated circuit of the present invention includes a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed. When the direction of extension of one of the plurality of wiring patterns is used as a reference direction, the plurality of dummy patterns are a plurality of inclined dummy patterns inclined at a predetermined angle toward the reference direction, and some of the plurality of inclined dummy patterns formed in a first wiring layer of the plurality of wiring layers cross some of the wiring patterns formed in a second wiring layer different from the first wiring layer when viewed in plane.

A semiconductor integrated circuit of the present invention includes a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed. When the direction of extension of one of the plurality of wiring patterns is used as a reference direction, the plurality of dummy patterns are a plurality of inclined dummy patterns inclined at a predetermined angle toward the reference direction, and some of the plurality of inclined dummy patterns are located the same distance away from one of the wiring patterns formed in one of the wiring layers in which said some of the plurality of inclined dummy patterns are formed.

In view of the above, the semiconductor integrated circuit of the present invention includes a plurality of dummy patterns inclined at an angle of, e.g., 45 degrees toward the reference direction representing the direction of extension of one arbitrary wiring pattern. These dummy patterns extend in parallel. Under such conditions, when a wiring pattern is formed in a wiring layer vertically adjacent to another wiring layer in which these inclined dummy patterns are formed to have an inclination angle of, e.g., 45 degrees, the overlapping area between this wiring pattern and the inclined dummy patterns each having an inclination angle of, e.g., 45 degrees is fixed independently of the location of the wiring pattern in the vertically adjacent wiring layer. Therefore, the magnitude of capacitance added to the wiring pattern formed in the adjacent wiring layer due to the inclined dummy patterns having an inclination angle of, e.g., 45 degrees becomes uniform independently of the location of the wiring pattern. In addition, the inclined dummy patterns having an inclination angle of, e.g., 45 degrees do not need to form the shape of a cross and can each form, for example, a rectangle having four vertices less than the number of the vertices of the cross, i.e., 12. This reduces the necessary data amount. Furthermore, the dummy patterns are inclined at an angle of, e.g., 45 degrees. Therefore, when these inclined dummy patterns are located in a part of a wiring layer located in the vicinity of wiring patterns formed in the same wiring layer, the total area of parts of these inclined dummy patterns close to the associated wiring patterns is reduced as compared with the case where dummy patterns are arranged parallel or orthogonal to wiring patterns as in the known art. As a result, additional capacitance added to wiring patterns due to the inclined dummy patterns is reduced. In addition, the arrangement of a plurality of inclined dummy patterns allows the aperture ratio to become a desired value.

In particular, since in the present invention the plurality of dummy patterns are located the same distance away from the associated wiring patterns, this can equalize additional capacitance applied, due to the dummy patterns, to each wiring pattern formed in a wiring layer in which the dummy patterns are formed per set unit length of the wiring pattern.

In the present invention, the inclined dummy patterns having an inclination angle of, e.g., 45 degrees form an angle of 90 degrees with respect to dummy patterns formed in another wiring layer. Therefore, the overlapping area between a dummy pattern and another dummy pattern formed in a wiring layer vertically adjacent to the wiring layer in which the dummy pattern is formed is fixed, thereby equalizing additional capacitance produced between dummy patterns formed in different wiring layers.

Furthermore, since in the present invention the dummy patterns adjacent to the associated wiring patterns are connected to the fixed potential, this can shield the influence of capacitive coupling from other wiring patterns. Moreover, since the semiconductor integrated circuit of the present invention includes not only the dummy patterns adjacent to the associated wiring patterns but also floating dummy patterns, the number of the dummy patterns that must be peeled off to modify the layout of the semiconductor integrated circuit can be reduced.

In addition, since in the present invention floating dummy patterns are used as the dummy patterns adjacent to the associated wiring patterns, the number of the dummy patterns that must be peeled off to modify the layout of the semiconductor integrated circuit can be reduced. Since the floating dummy patterns are interposed between the potential-fixed dummy patterns connected to the fixed potential and the wiring patterns, the potential-fixed dummy patterns are away from the associated wiring patterns, and additional capacitance is connected in series between the fixed potential and the associated wiring patterns. This reduces additional capacitance added to the associated wiring patterns by the potential-fixed dummy patterns.

EFFECTS OF THE INVENTION

As described above, the semiconductor integrated circuit of the present invention can reduce additional capacitance produced between wiring patterns and dummy patterns formed in the same wiring layer and equalize additional capacitance produced between the dummy patterns and associated wiring patterns formed in another wiring layer adjacent to the wiring layer. This can enhance the calculation accuracy for extracting a parasitic capacitance.

In particular, according to the present invention, a plurality of dummy patterns are located the same distance away from associated wiring patterns formed in a wiring layer in which the dummy patterns are formed. This can equalize additional capacitance applied to each wiring pattern by these dummy patterns per set unit length of the wiring pattern.

According to the present invention, the overlapping area between dummy patterns formed in any vertically adjacent pair of wiring layers is fixed, thereby equalizing additional capacitance produced between dummy patterns formed in different wiring layers. This can enhance the calculation accuracy for extracting a parasitic capacitance.

According to the present invention, potential-fixed dummy patterns adjacent to associated wiring patterns can provide a so-called shielding effect and reduce crosstalk. Furthermore, since the semiconductor integrated circuit includes floating dummy patterns that can be easily peeled off, this facilitates rerouting.

Moreover, according to the present invention, potential-fixed dummy patterns are interposed between the wiring patterns and floating dummy patterns. This can reduce additional capacitance applied to the associated wiring patterns by the potential-fixed dummy patterns. This can enhance the calculation accuracy for extracting a parasitic capacitance.

Figure 1:
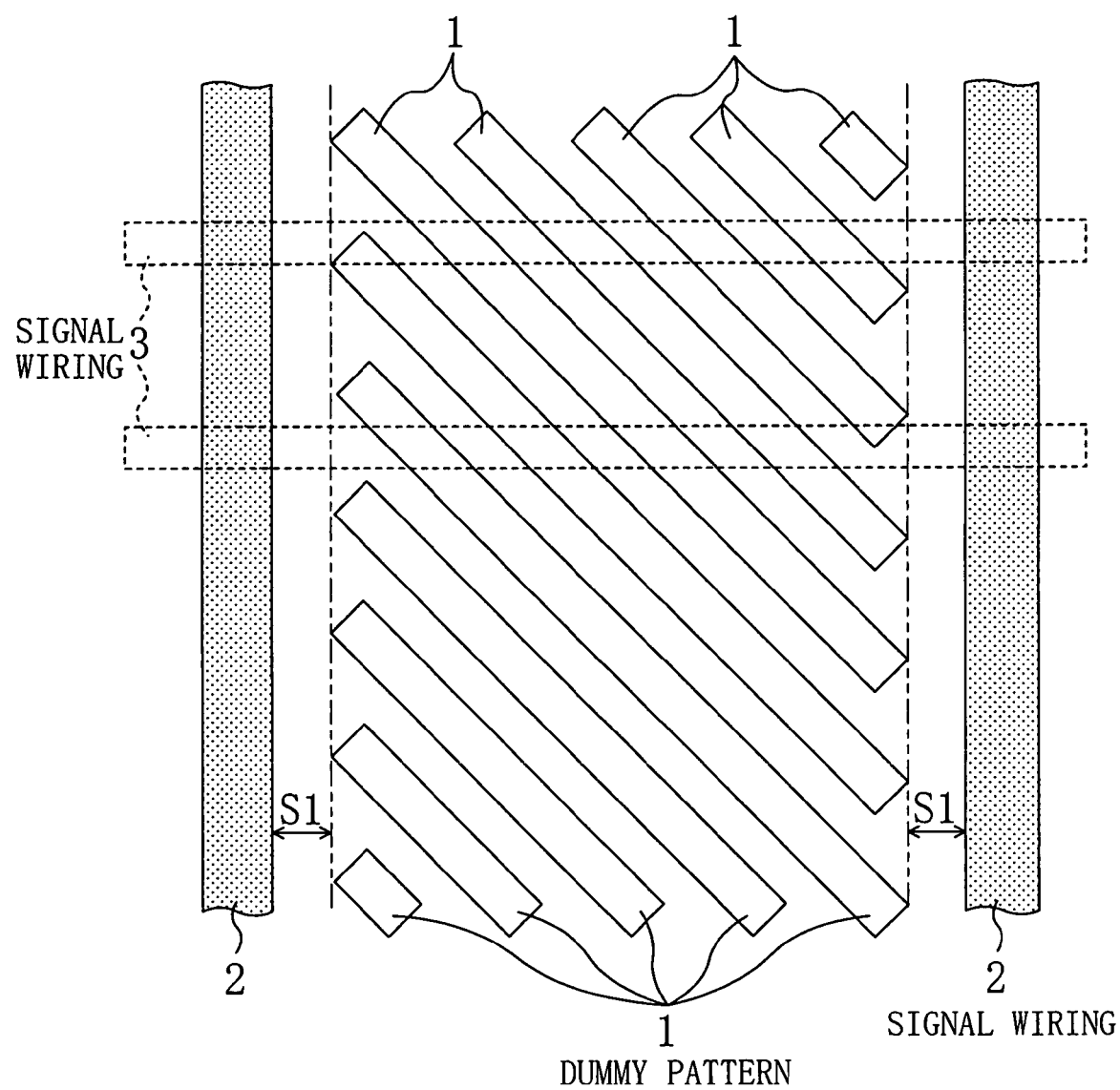
FIG. 1 is a diagram illustrating the structure of an essential part of a semiconductor integrated circuit according to a first embodiment of the present invention.

DESCRIPTION OF REFERENCE NUMERALS 1 dummy patterns (inclined dummy patterns)
2 signal wiring patterns (wiring patterns)
3 signal wiring patterns in adjacent wiring layer
5 connection patterns
11 potential-fixed dummy patterns
12 small dummy patterns (floating dummy patterns)
13 upper dummy patterns

BEST MODE FOR CARRYING OUT THE INVENTION

Embodiment 1

Figure 2:
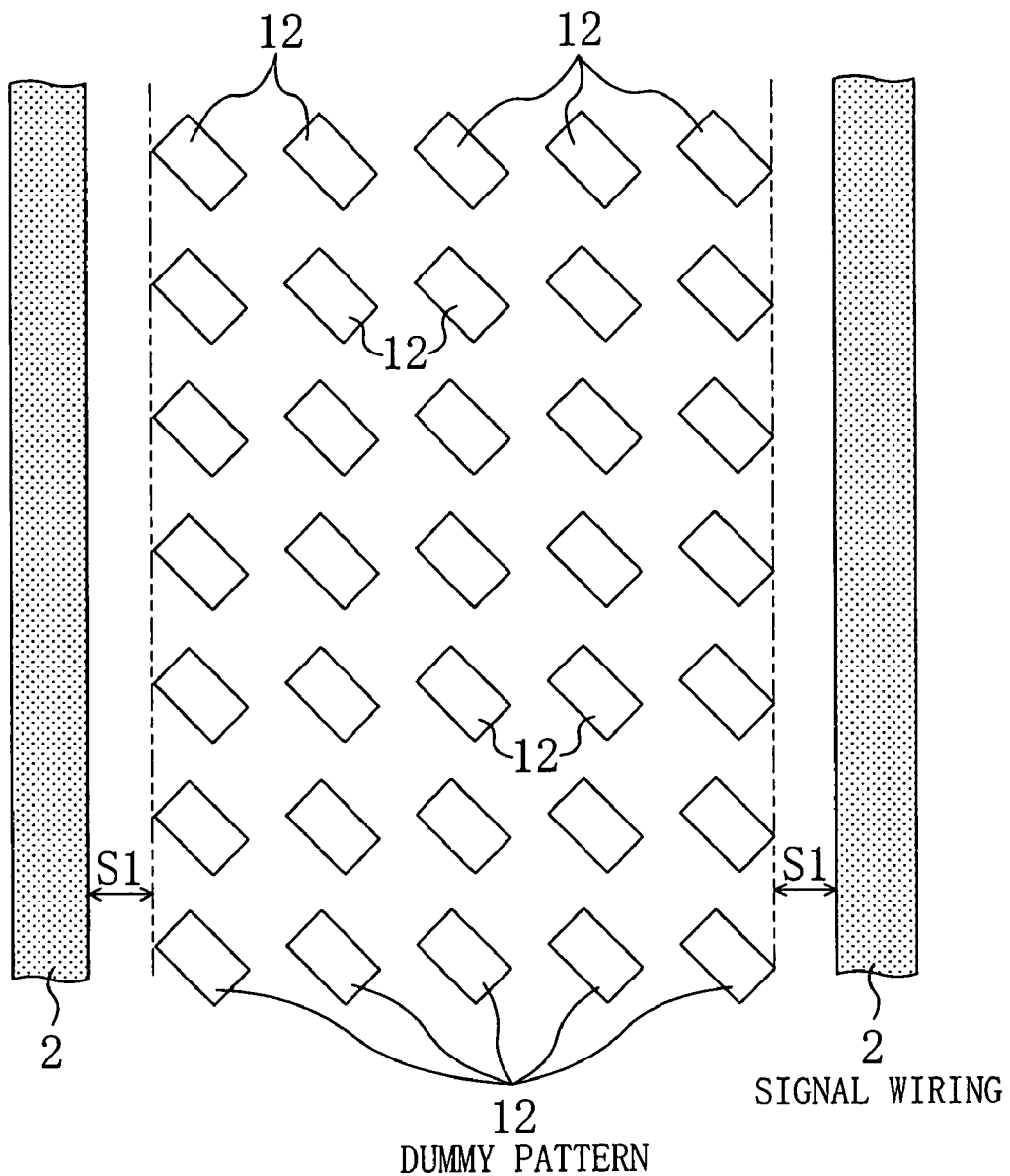
FIG. 2 is a diagram illustrating the state of dummy patterns divided into small pieces in a modification of the semiconductor integrated circuit.

An embodiment of the present invention will be described hereinafter with reference to FIGS. 1 and 2. Referring to FIG. 1, rectangular dummy patterns 1 having the same width and different lengths are arranged in an empty region of a wiring layer in which two signal wiring patterns 2 out of a plurality of wiring patterns (real pattern group) forming part of a semiconductor integrated circuit are formed, i.e., a region thereof in which no signal wiring pattern is formed, so as to be inclined at an angle of generally 45 degrees toward the signal wiring patterns 2. The rectangular dummy patterns 1 are arranged parallel to one another and spaced uniformly. Signal wiring patterns 3 are formed in another wiring layer adjacent to the wiring layer for the dummy patterns 1 and the signal wiring patterns 2, e.g., a wiring layer located immediately above the wiring layer for the dummy patterns 1 and the signal wiring patterns 2, and form part of the semiconductor integrated circuit. Referring to FIG. 2, dummy patterns 12 are provided by dividing the dummy patterns 1 illustrated in FIG. 1 into small pieces. In FIGS. 1 and 2, the plurality of dummy patterns 1 and some of the dummy patterns 12 adjacent to the signal wiring patterns 2 are located a set distance S1 away from the associated signal wiring patterns 2.

In the above-mentioned manner, the dummy patterns 1 or 12 are arranged between the two signal wiring patterns 2 illustrated in FIG. 1 or 2 along the direction forming an angle of generally 45 degrees with respect to the direction in which each signal wiring pattern (wiring pattern) 2 extends (reference direction). In FIG. 1, the dummy patterns 1 are placed to form an angle of generally 45 degrees also with respect to the signal wiring patterns (second signal wiring patterns) 3 routed through a wiring layer (second wiring layer) different from the wiring layer (first wiring layer) in which the dummy patterns 1 are placed. With this placement, parts of some of the dummy patterns 1 crossing the associated signal wiring patterns 3 are regularly arranged along the associated signal wiring patterns 3. For this reason, additional capacitance applied to each signal wiring pattern 3 by the associated dummy patterns 1 per set unit length of the signal wiring pattern 3 is fixed independently of the location of the signal wiring pattern 3. Furthermore, the signal wiring patterns 3 illustrated in FIG. 1 extend laterally. However, since the dummy patterns 1 are placed to form an angle of generally 45 degrees with respect to the signal wiring patterns 2, additional capacitance per set unit length of each signal wiring pattern 3 can likewise become uniform even with the signal wiring pattern 3 extending longitudinally. Furthermore, since the signal wiring patterns 2 are located the same distance, i.e., the set distance S1, away from the plurality of dummy patterns 1 or 12 adjacent to the signal wiring patterns 2, additional capacitance arising from the dummy patterns 1 or 12 per set unit length can also become uniform.

In this embodiment, the dummy patterns 1 are inclined at an angle of generally 45 degrees toward the signal wiring patterns 2 and 3. Although not shown, the dummy patterns 1 need only form a predetermined angle with respect to the signal wiring patterns 2 to the extent that at least two dummy patterns 1 cross one signal wiring pattern 3. In this case, the signal wiring pattern (second signal wiring pattern) 3 crosses the at least two dummy patterns (a plurality of inclined dummy patterns) 1 such that a part of the signal wiring pattern 3 coinciding with each dummy pattern 1 when viewed in plane form the same shape regardless of the location of the signal wiring pattern 3. In view of the above, like the case where the inclination angle of the dummy pattern 1 is generally 45 degrees, additional capacitance per set unit length of the signal wiring pattern 3 can become uniform. However, in the above-mentioned case, additional capacitance per set unit length differs according to whether the signal wiring pattern 3 extends laterally or longitudinally.

Furthermore, since in FIG. 1 the dummy patterns 1 are placed adjacent to the associated signal wiring patterns 2 formed in the layer in which the dummy patterns 1 are formed so as to be inclined at an angle of generally 45 degrees toward the signal wiring patterns 2, the dummy patterns 1 are a longer distance away from the associated signal wiring patterns 2 than in cases where the dummy patterns 1 are orthogonal or parallel to the signal wiring patterns 2. More particularly, in cases where the dummy patterns 1 are orthogonal or parallel to the signal wiring patterns 2, two vertices of each dummy pattern 1 located in the vicinity of associated one of the signal wiring patterns 2 are the same distance away from the associated signal wiring pattern 2. Meanwhile, when the dummy pattern 1 is inclined at an angle of generally 45 degrees, one of the vertices moves further away from the associated signal wiring pattern 2 with the location of the other vertex maintained. This means that the dummy pattern 1 is away from the associated signal wiring pattern 2 to the extent that one of the vertices moves further away from the associated signal wiring pattern 2. This can reduce additional capacitance added to the associated signal wiring pattern 2. In view of the above, if dummy patterns are formed in an empty region of a wiring layer having a predetermined area so as to be inclined at an angle of generally 45 degrees, this can advantageously further restrain the additional capacitance. In this embodiment, a description was given of the case where the dummy patterns 1 form an angle of generally 45 degrees with respect to the signal wiring patterns 2. However, other modifications may be used. For example, in order to prevent the dummy patterns 1 from being orthogonal or parallel to the signal wiring patterns 2, the dummy patterns 1 are inclined at such a predetermined angle that one of the above-mentioned two vertices of each dummy pattern 1 moves further away from the associated signal wiring pattern 2 than the other vertex. In this manner, the additional capacitance for the associated signal wiring pattern 2 can be likewise reduced.

In FIG. 2, the dummy patterns 12 obtained by dividing the dummy patterns 1 into small pieces are placed. In this way, additional capacitance produced when some of the dummy patterns 12 are located adjacent to the associated signal wiring patterns 2 formed in the layer in which the dummy patterns 12 are formed depends on the size of each dummy pattern 12. Therefore, in FIG. 2, the additional capacitance for the signal wiring patterns 2 can be reduced as compared with the case illustrated in FIG. 1. However, use of the dummy patterns 12 increases the data amount. Therefore, the number of small pieces into which the dummy pattern 1 is divided is desirably kept to a minimum.

Figure 3:
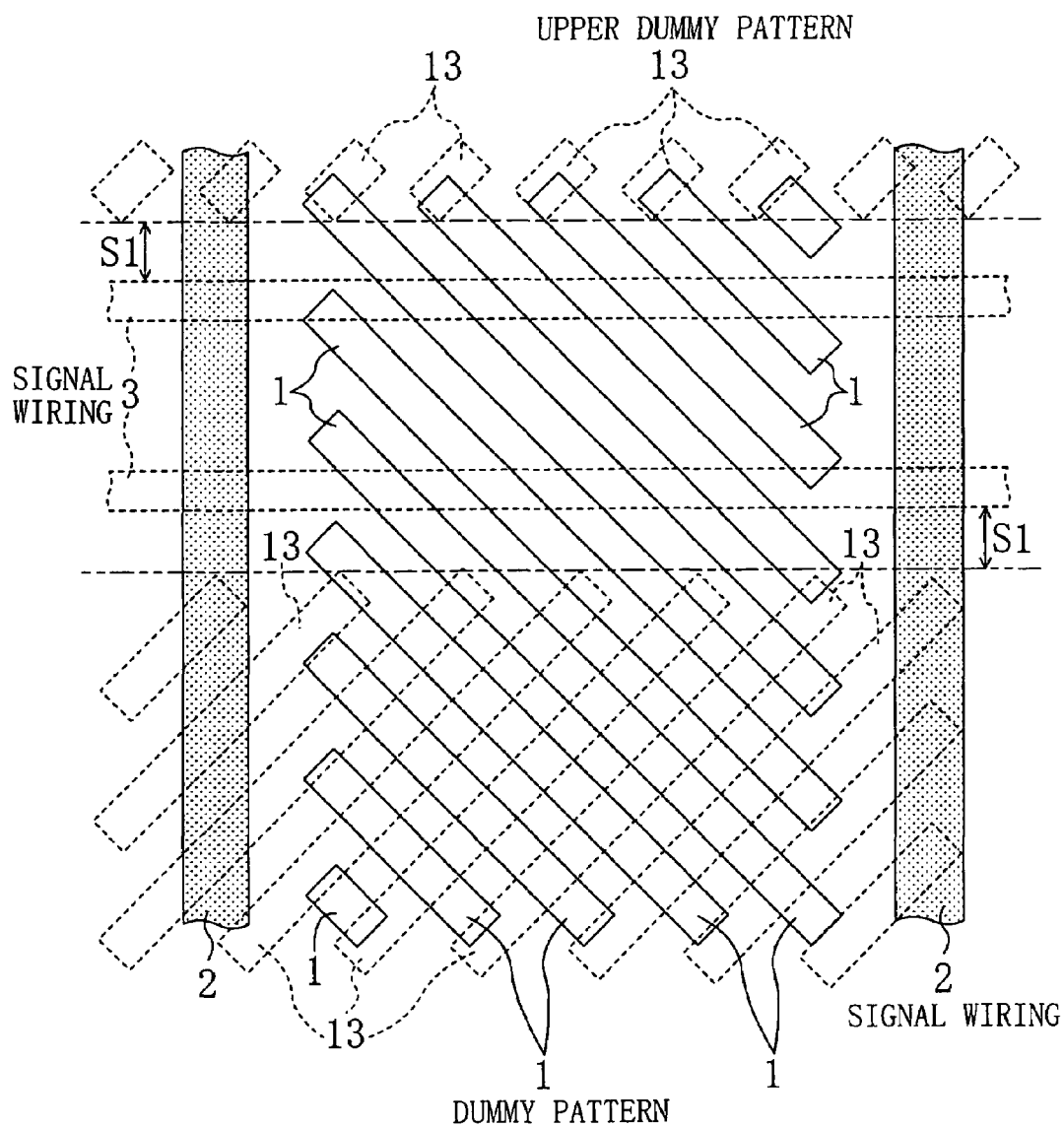
FIG. 3 is a diagram illustrating the layout relationship between dummy patterns respectively formed in two vertically adjacent wiring layers in the semiconductor integrated circuit.

Meanwhile, FIG. 3 illustrates the configuration of a part of a semiconductor integrated circuit. In this configuration, a plurality of inclined dummy patterns 13 are placed in a wiring layer in which signal wiring patterns 3 are formed to cross inclined dummy patterns 1 formed in another wiring layer immediately below the wiring layer at an angle of generally 90 degrees. More particularly, the plurality of dummy patterns 13 formed in the upper wiring layer are placed so as to be inclined at an angle of generally 45 degrees toward the direction of routing of the signal wiring patterns 2 used as the reference direction. The direction of inclination of the dummy patterns 13 is opposite to the direction of inclination of the plurality of dummy patterns 1 formed in the lower wiring layer.

In FIG. 3, the layout relationship between the plurality of dummy patterns 1 and 13 respectively formed in two adjacent wiring layers is illustrated. Also for other wiring layers, inclined dummy patterns formed in the upper one of two vertically adjacent wiring layers cross inclined dummy patterns formed in the lower wiring layer at an angle of generally 90 degrees. The overlapping area between a plurality of dummy patterns 1 and a plurality of dummy patterns 13 respectively formed in two vertically adjacent wiring layers is fixed. As a result, additional capacitance produced between vertically adjacent pairs of dummy patterns formed in vertically adjacent pairs of wiring layers is equalized among vertically adjacent pairs of wiring layers. This allows the extraction accuracy of parasitic elements to increase.

The extending dummy patterns 1 and 13 were described with reference to FIG. 3. It is needless to say that, as illustrated in FIG. 2, the angle of intersection of small inclined dummy patterns 12 respectively formed in two vertically adjacent wiring layers may be set at generally 90 degrees.

Although, in FIGS. 1, 2 and 3, the dummy patterns 1, 12 and 13 are rectangular, the shapes of these dummy patterns of the present invention are not limited. On condition that a plurality of dummy patterns are not rectangular, if the plurality of non-rectangular dummy patterns are arranged regularly so as to be inclined at an angle of generally 45 degrees toward signal wiring patterns, the overlapping area between these dummy patterns and each of signal wiring patterns formed in another wiring layer adjacent to the wiring layer in which the dummy patterns are formed is fixed independently of the location of the signal wiring pattern. Therefore, the magnitude of capacitance added, by the dummy patterns, to each signal wiring pattern formed in one of the wiring layers adjacent to the wiring layer in which the dummy patterns are formed can be equalized independently of the location of the signal wiring pattern in the wiring layer.

If, as illustrated in FIG. 3, the plurality of dummy patterns 13 are located the same set distance S1 away from the adjacent signal wiring patterns 3 formed in the wiring layer in which the dummy patterns 13 are formed, this can equalize the magnitude of additional capacitance added to each signal wiring pattern 3 formed in the wiring layer in which the dummy patterns 13 are formed due to the existence of these dummy patterns 13 per set unit length of the signal wiring pattern 3. However, when the shapes of the dummy patterns 13 become complicated, this increases the data amount for the inclined dummy patterns 13.

Embodiment 2

Figure 4:
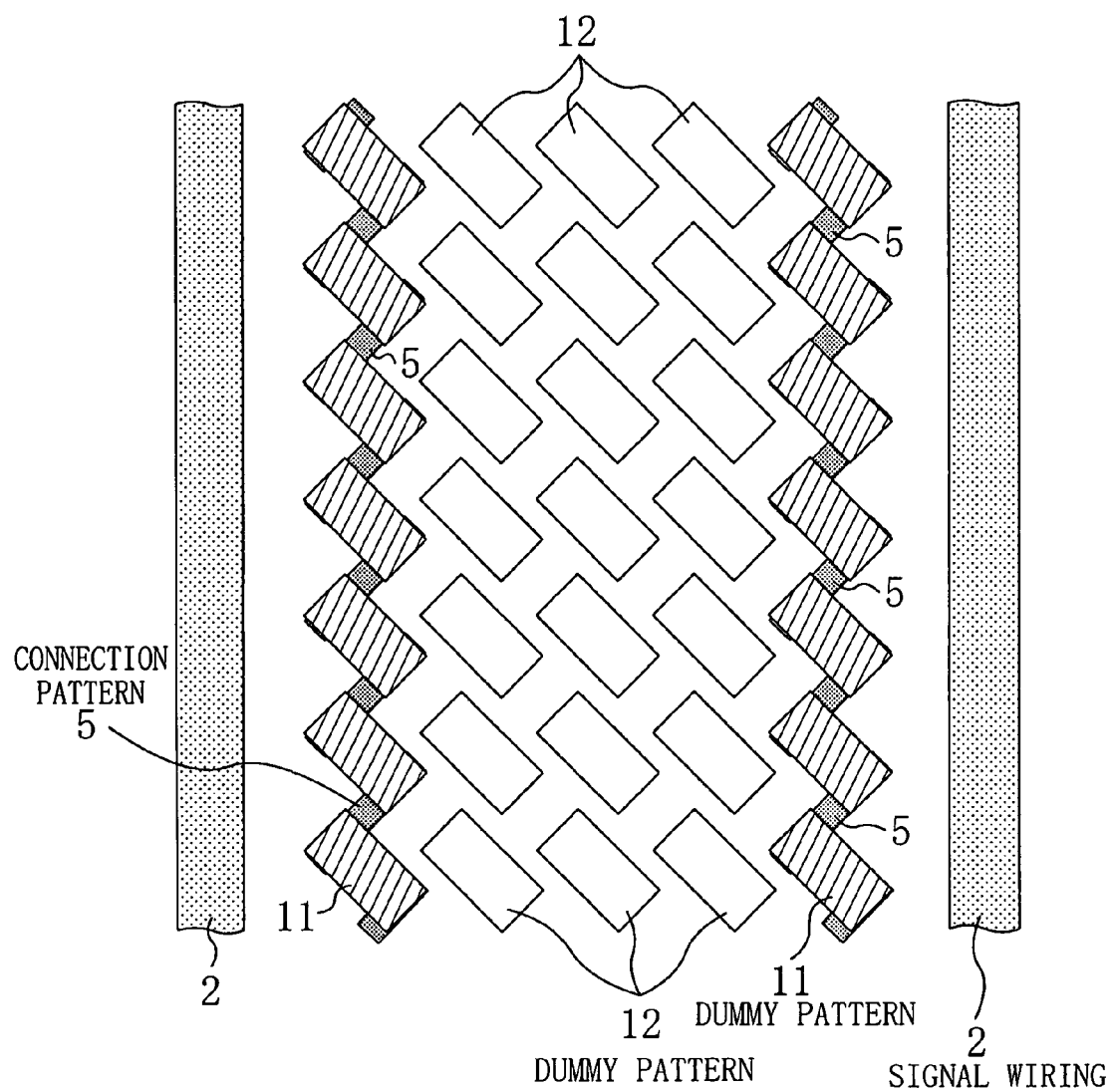
FIG. 4 is a diagram illustrating the structure of an essential part of a semiconductor integrated circuit according to a second embodiment of the present invention.

A second embodiment will be described hereinafter with reference to FIG. 4. In FIG. 4, dummy patterns 11 represent dummy patterns connected to a fixed potential, such as a power supply or the ground, dummy patterns 12 represent floating patterns that are not electrically connected to any of a plurality of wiring patterns including signal wiring patterns 2 and forming part of a semiconductor integrated circuit, and connection patterns 5 represent wiring patterns that provide connection between adjacent pairs of the dummy patterns 11. These dummy patterns 11 and 12 are placed in a region where the signal wiring patterns 2 are not placed in order to adjust the area ratio.

Unlike FIG. 2, in FIG. 4, the dummy patterns 11 connected to the power supply or the ground are placed adjacent to the associated signal patterns 2. In this way, capacitive coupling provided between the two signal wiring patterns 2 through the dummy patterns 12 is mostly eliminated. The above-mentioned placement can provide a so-called shielding effect and reduce crosstalk. In this embodiment, all of the dummy patterns 11 adjacent to the associated signal wiring patterns 2 do not need to be connected to the fixed potential. If at least one of the dummy patterns 11 is connected to the fixed potential (not shown), the shielding effect of the present invention can be provided at least for the at least one dummy pattern 11.

The dummy patterns 12 are all floating dummy patterns. Therefore, even when the layout of the semiconductor integrated circuit is to be modified, only the dummy patterns located in a region of the semiconductor integrated circuit to be modified in layout can be peeled off. However, as described in this embodiment, all of the dummy patterns 12 do not need to be floating. If some of the dummy patterns 12 are floating, the effect of the present invention can be provided in modifying the layout of a part of the semiconductor integrated circuit in the vicinity of these floating patterns 12. On condition that the layout of the semiconductor integrated circuit is to be modified, if the number of the dummy patterns 12 that need to be peeled off is minimized, this minimization facilitates rerouting. Therefore, 50% or more of the dummy patterns 12 are desirably floating dummy patterns.

Although not shown, when the state illustrated in FIG. 4 is replaced with the state in which dummy patterns 12 are connected to a fixed potential, such as a power supply or the ground, and dummy patterns 11 are floating dummy patterns, the shielding effect can be provided in the same manner as in the arrangement of dummy patterns illustrated in FIG. 4, and the additional capacitance added to the signal wiring patterns 2 can be reduced as compared with that in FIG. 4. The reason for this is as follows. Since the dummy patterns 12 connected to the power supply or the ground are further away from the signal wiring patterns 2, this reduces additional capacitance. Furthermore, since the floating dummy patterns 11 are interposed between the dummy patterns 12 whose potentials are fixed to the power supply or the ground and the signal wiring patterns 2, capacitance is connected in series between the fixed potential and the associated signal wiring patterns 2, resulting in further reduced additional capacitance. In this case, all of the floating dummy patterns 11 adjacent to the signal wiring patterns 2 do not need to be floating. If at least some of the dummy patterns 11 are floating, the effect of the present invention can act on the floating dummy patterns 11.

INDUSTRIAL APPLICABILITY

In the arrangement of dummy patterns according to the present invention, dummy patterns are inclined at an angle of generally 45 degrees toward wiring patterns serving as real patterns. This can reduce additional capacitance added to the wiring patterns. Furthermore, dummy patterns formed in a wiring layer are orthogonal to dummy patterns formed in an adjacent wiring layer. This can equalize additional capacitance produced between adjacent pairs of wiring layers, resulting in improved timing design. The arrangement of dummy patterns according to the present invention is useful for semiconductor integrated circuits and other devices designed by an LSI design on which rigid timing constraints are imposed.

The invention claimed is:

1. A semiconductor integrated circuit comprising a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed, wherein, when the direction of extension of one of the plurality of wiring patterns is used as a reference direction, the plurality of dummy patterns extend in a direction forming an angle of 45 degrees with respect to the reference direction, and the plurality of dummy patterns include a potential-fixed dummy pattern connected to a fixed potential and floating dummy patterns prevented from being connected to a fixed potential, some of the floating dummy patterns are located adjacent to the associated wiring patterns, and one of the dummy patterns adjacent to said some of the floating dummy patterns located adjacent to the associated wiring patterns is the potential-fixed dummy pattern.

2. The semiconductor integrated circuit of claim 1, wherein some of the plurality of dummy patterns adjacent to any one of the plurality of wiring patterns are located the same distance away from said any one of the plurality of wiring patterns.

3. The semiconductor integrated circuit of claim 1, wherein the plurality of dummy patterns are rectangular.

4. The semiconductor integrated circuit of claim 3, wherein the plurality of dummy patterns include a plurality of rectangles having different sizes.

5. The semiconductor integrated circuit of claim 1, wherein some of the plurality of dummy patterns formed in one of the plurality of wiring layers cross some other ones of the plurality of dummy patterns formed in vertically adjacent one of the plurality of wiring layers at an angle of 90 degrees.

6. The semiconductor integrated circuit of claim 1, wherein the floating dummy patterns make up 50% or more of the number of the plurality of dummy patterns.

7. The semiconductor integrated circuit of claim 1, wherein the fixed potential is a power supply potential or a ground potential.

8. A semiconductor integrated circuit comprising a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed, wherein, when the direction of extension of one of the plurality of wiring patterns is used as a reference direction, the plurality of dummy patterns are a plurality of inclined dummy patterns inclined at a predetermined angle toward the reference direction, some of the plurality of inclined dummy patterns formed in a first wiring layer of the plurality of wiring layers cross some of the wiring patterns formed in a second wiring layer different from the first wiring layer when viewed in plane, and the plurality of dummy patterns include a potential-fixed dummy pattern connected to a fixed potential and floating dummy patterns prevented from being connected to a fixed potential, some of the floating dummy patterns are located adjacent to the associated wiring patterns, and one of the dummy patterns adjacent to said some of the floating dummy patterns located adjacent to the associated wiring patterns is the potential-fixed dummy pattern.

9. A semiconductor integrated circuit comprising a real pattern group including a plurality of wiring patterns for providing connection either between a pair of circuits, between a pair of elements or between a circuit and an element, the real pattern group being formed in each of a plurality of wiring layers, and a plurality of dummy patterns formed in a region of each said wiring layer in which the real pattern group is not placed, wherein, when the direction of extension of one of the plurality of wiring patterns is used as a reference direction, the plurality of dummy patterns are a plurality of inclined dummy patterns inclined at a predetermined angle toward the reference direction, some of the plurality of inclined dummy patterns are located the same distance away from one of the wiring patterns formed in one of the wiring layers in which said some of the plurality of inclined dummy patterns are formed, and the plurality of dummy patterns include a potential-fixed dummy pattern connected to a fixed potential and floating dummy patterns prevented from being connected to a fixed potential, some of the floating dummy patterns are located adjacent to the associated wiring patterns, and one of the dummy patterns adjacent to said some of the floating dummy patterns located adjacent to the associated wiring patterns is the potential-fixed dummy pattern.

* * * * *